United States Patent [19]

Stein et al.

[11] Patent Number: 4,706,043
[45] Date of Patent: Nov. 10, 1987

[54] FREQUENCY STANDARD USING HYDROGEN MASER

[75] Inventors: Samuel R. Stein; Lindon L. Lewis, both of Boulder; Thomas E. Smith, Westminster, all of Colo.

[73] Assignee: Ball Corporation, Muncie, Ind.

[21] Appl. No.: 866,827

[22] Filed: May 23, 1986

[51] Int. Cl.$^4$ .............................................. H01S 1/06
[52] U.S. Cl. ....................................... 331/94.1; 331/3
[58] Field of Search ................................... 331/94.1, 3

[56] References Cited

U.S. PATENT DOCUMENTS

| | | | |
|---|---|---|---|
| 2,698,923 | 1/1955 | Edson | 333/83 |
| 3,792,368 | 2/1974 | Audoin | 331/3 |
| 4,122,408 | 10/1978 | Walls | 331/3 |
| 4,123,727 | 10/1978 | Peters | 331/94.1 |

OTHER PUBLICATIONS

Helwig, H. & Walls, F. L.; A New . . . of Passively Operating Hydrogen Frequency Standard; Proc. 30th Annual Sump. on Freq. Control, pp. 473–480 (1976).
Crampton, S. B.; Fleri, E. C. & Wang H. T. M.; Effects of Atomic Reasonance Broadening Mechanisms on Atomic Hydrogen Maser Long Term Frequency Stability; Metrologia 13v pp. 131–135 (1977).
Howe, D. A., Walls, F. L., Bell, H. E. & Hellwig, H.; A Small Passively Operated Hydrogen Maser; Proc. 33rd Annual Symp. on Freq. Control, pp. 554 et seq. (1979).

Primary Examiner—Eugene R. LaRoche
Assistant Examiner—Robert J. Pascal
Attorney, Agent, or Firm—Gilbert E. Alberding

[57] ABSTRACT

A compact, self-contained and economical frequency standard uses a passive hydrogen maser to provide an accurate, repeatable, and stable standard frequency. The hydrogen dissociator and microwave cavity of the maser and circuit means coact to reduce the frequency variations possible with prior systems and to promote and emphasize the energy transfer from hyperfine hydrogen atoms to the frequency standard for its stabilization. The dissociator is accurately alignable to transfer its hyperfine hydrogen atoms of a selected state to a microwave cavity; and the microwave cavity is formed by dielectric surfaces which have been coated with a conductive coating in a predetermined configuration to suppress oscillation in undesirable modes. The dissociator and microwave cavity thus coact to present within the microwave cavity a maximum obtainable portion of hyperfine hydrogen atoms generated by the dissociator and to enhance the release of and the detection of the energy released by the hyperfine hydrogen atoms at hydrogen resonance frequency. The circuit means reliably lock the carrier frequency generated from the standard frequency of a VCXO at hydrogen resonance frequency rather than one of the phase modulation sidebands of the carrier, resulting in a predictable, accurate, and stable standard frequency.

30 Claims, 8 Drawing Figures

FREQUENCY STANDARD USING HYDROGEN MASER

BACKGROUND OF THE INVENTION

The present invention relates, in general, to frequency standards and, more particularly, to frequency standards using hydrogen masers to maintain a stable standard frequency that is free of drift.

An atomic frequency standard is a device having a basic resonant system derived from an atomic or molecular specie experiencing a transition between two well-defined energy levels of the atom or molecule. The transition occurs in a reasonably convenient domain of the electromagnetic spectrum, the microwave region. The transition is employed as a highly stable frequency reference to which the frequency of a voltage-controlled crystal oscillator (VCXO) can be electronically locked. Thus, the high stability and relative insensitivity associated with an atomic reference frequency is thereby transferred to the VCXO.

Hydrogen, cesium and rubidium frequency standards can provide atomic-controlled oscillators in which the frequency of usually a 5 MHz or 10 MHz quartz crystal oscillator is controlled by means of a physics package and associated electronics that are devoted to maintaining that assigned output on a very long-term, exceedingly accurate and stable basis. By properly slaving the quartz crystal oscillator to the frequency of the atomic transition, the tendency of the quartz crystal to exhibit drifting due to aging and other inherent as well as environmental effects is markedly suppressed.

In a hydrogen maser frequency standard, hydrogen is customarily stored under pressure in a container and is passed through and purified by a hot palladium-silver alloy diffusion barrier that provides control of the hydrogen flux and subsequent beam intensity. The hydrogen, in molecular form, is introduced into an electrical discharge defined by a dissociation chamber which dissociates diatomic hydrogen into atomic hydrogen. Thereafter, the resultant hydrogen atoms emerge in a low-pressure region, are collimated into a beam and directed or focused through a state selection device, usually having a passageway of a few millimeters in diameter. The state selection device may be a hexapole or quadrapole magnet having a magnetic flux density at the pole tips of generally about 0.7 T or more. The state selection device generates an inhomogeneous magnetic field and is designed in such a manner so as to withdraw atoms in the lower hyperfine energy state and allows those hydrogen atoms to pass having the upper hyperfine state into a high Q-cavity resonator located in a microwave field region. In the resonator, the atoms of hydrogen undergo interaction with a microwave field at a resonance frequency of about 1.4 GHz.

The cavity resonator into which the selected atoms of hydrogen are directed is surrounded by magnetic shields and is provided with an inner solenoid that creates a weak, substantially uniform magnetic field which is applied to the microwave field region in order to separate the different sublevels of the hyperfine state to insure that transitions occur only between levels where the Zeeman effect is quadratic.

The cavity resonator is designed to allow extremely long interaction times of atoms with the microwave field by coating the walls of the resonator with special compositions, generally a fluorocarbon or the like to reduce atom perturbations through wall collisions. The interaction with the microwave field induces the hydrogen atoms in the selected energy state to make a transition to the lower state, thus radiating energy of a precise frequency to the field. In an active maser system, maser oscillations are self-sustaining when the atom density in the cavity resonator is such that the resultant induced transitions radiate enough coherent energy to more than offset cavity losses.

The hydrogen that departs from the cavity resonator may be readily removed by a vacuum system, generally by means of a high speed, getter pump along with a titanium sputter ion pump, both of which are generally housed in separate vacuum chambers. The getter materials that may be used for such a pump include Zr-Al, Zr-C and Zr-V alloys.

Although the general conditions recited above relate to an active maser mode, viz., using the maser principle itself in which there is coherent stimulated emission of the radiation within a suitable resonant structure, there is another mode, the so-called passive mode which may be employed for standard frequency generators. In the passive mode, an ensemble of particles (i.e. atoms or molecules) undergoing the desired quantum transition and an auxiliary source of radiation (slave oscillator) is employed to produce the transitions which occur when the frequency of the radiation is near the atomic resonance frequency. Thus, in a passive frequency standard, the atomic resonance has to be probed by an electromagnetic signal at the proper frequency which is produced by an auxiliary frequency generator whereas in an active frequency standard there is self-sustaining oscillation at the atomic resonance frequency.

In 1920 R. W. Wood was the first to employ a device to generate atomic hydrogen. Since then others have employed various means to produce atomic hydrogen including aerodynamic shock tubes, thermal dissociation means as well as radio frequency discharge devices. This latter technique has proven most convenient and, therefore, has been a preferred technique used in the art. In general, a r.f. discharge is employed in which external electrodes are placed proximate a glass dissociation chamber to produce a r.f. field capacitively or inductively coupled to a gaseous discharge or plasma generated within the chamber. The resultant hydrogen atoms emerge from the chamber into a low-pressure region through an orifice to define a stream of atomic hydrogen in the form of a beam.

The stream of hydrogen atoms leaving the dissociation chamber includes atoms at several energy states, and hydrogen atoms that are not at the desired hyperfine energy state are focused out of the beam generally by a state selector magnet through which the stream of hydrogen atoms is directed.

The hydrogen atoms in the selected hyperfine energy state are then directed into a microwave cavity that is resonant at about the hydrogen resonance frequency of about 1.4 GHz. To obtain effective operation of a passive maser, it is desirable that the cavity be maintained at the hydrogen resonance frequency and that the microwave energy introduced into the cavity be maintained at hydrogen resonance frequency. Unfortunately, environmental perturbations, such as changes in pressure, aging of cavity coatings, deformation of the cavity due to strain or shock or temperature changes, and cavity pulling detune the cavity. In addition, the electronic components used to provide the microwave energy to the cavity are also subject to aging and environmental changes which produce a change or drift in frequency.

To correct for cavity detuning and frequency changes and to eliminate drift and provide a stable standard frequency source, the microwave energy introduced into the microwave cavity has been modulated by two frequencies. One frequency modulation is adapted to probe the microwave cavity for the effects of detuning influences and to permit the generation of a corrective action for cavity detuning, and another much smaller frequency modulation is adopted to permit generation of an error signal for deviations of frequency of the microwave radiation introduced into the cavity from hydrogen resonance frequency and maintenance of the frequency of the microwave radiation at the hydrogen resonance frequency. Such corrective methods and apparatuses are disclosed in U.S. Pat. Nos. 3,792,368 and 4,122,408 and in "A Small Passively Operated Hydrogen Maser", D. A. Howe, F. L. Walls, Howard E. Bell, and H. Hellwig, published in Proc. 33rd Annual Symposium on Frequency Control, (1979), pp. 554–592.

As yet no compact, relatively inexpensive, self-contained, passive hydrogen maser frequency standard has been commercially available which may be reliably and easily used in non-laboratory environments. Such a practical, commercial passive hydrogen maser frequency standard is believed to have been inhibited by a number of factors which have militated against the effective and reliable use of the hydrogen hyperfine transition in a passive maser.

The beam-producing device is a critical component for microwave amplification, in the maser and similar desires. As can be appreciated the efficiency of producing a stream of atoms, such as hydrogen, determines to a large measure the available flux of the beam and, accordingly, the stability of the maser.

It follows from the above considerations that proper alignment is essential in placing a stream of atomic species in a favorable directional mode. For an atomic maser, it is essential that a beam of atoms be directed through a state selector and into the cavity resonator. Although a number of dissociation devices with fixed configurations have been employed, none have actually provided adequate focusing or alignment means offered directly from the discharge source, a shortcoming that has heretofore been neglected. Admittedly, the path is a straight one as the stream must pass through a state selector having a magnetic field as well as through a cavity tube leading into the cavity resonator of the maser. However, there is a need for fine angular adjustment through the magnetic field in order to optimize the effectiveness of the maser operation. Heretofore no practical steering or alignment device has been available for this critical aspect of precisely adjusting and directing atomic beams into cavity resonators and the like.

In addition, the microwave cavity has a tendency to oscillate in undesirable modes of oscillation; and such undesirable oscillations adversely affect the frequency of the transition of the hydrogen atoms between their hyperfine energy states, as measured by the circuit means coupled to the microwave cavity.

Furthermore, because the circuit means to detect variations of cavity energy due to variations in the microwave cavity and provide a corrective action to the cavity for aging and environmental perturbations uses relatively large frequency modulation, e.g., 12 KHz; and because the circuit means to detect variation of cavity energy due to variations in the frequency of the introduced microwave energy from the hydrogen resonance frequency and provide a corrective action to the VCXO uses a small frequency modulation, e.g., 12 Hz, there is a tendency for one of the phase modulation sidebands due to the small frequency modulation, particularly one of the sidebands separated from the carrier by an even number of modulation intervals, e.g., the second upper or second lower sideband, to become locked with the hydrogen resonance energy in the microwave cavity, resulting in instability, unpredictable frequency changes, inaccuracy, and lack of repeatability.

BRIEF SUMMARY OF THE INVENTION

This invention permits the effective use of a passive hydrogen maser in a compact, self-contained and economical frequency standard which may be used easily to provide an accurate, repeatable, and stable standard frequency. The frequency standard of this invention may be used with a GPS receiver to achieve timing accuracy of better than ten nanseconds per day and unsurpassed long-term timekeeping, and permits substantial improvements in navigation and communications. The hydrogen dissociator, microwave cavity and circuit means of this invention coact to reduce the frequency variations possible with prior systems and to promote and emphasize the energy transfer from hyperfine hydrogen atoms to the frequency standard for its stabilization.

In this invention, a dissociator is provided with and is defined by a base, a dissociation chamber for generating a narrow stream of hydrogen atoms having an opening forming a narrow stream of exiting atomic hydrogen, means adjacent said chamber for dissociating said molecular hydrogen to form said stream of atomic hydrogen, yieldable member means connected to said chamber, and means for asserting displacement of the yieldable member means to orient the dissociation chamber.

The yieldable member means preferably comprises a flexible body that supports the dissociation chamber and generally surrounds said chamber. As part of the yieldable member a flexible tubing or conduit is employed to interconnect the source of molecular hydrogen with said dissociation chamber. The yieldable member surrounding the chamber comprises an outer wall connected to the base and an inner wall spaced from said outer wall and connected to the dissociation chamber, said inner and outer walls being connected by an intermediate section. The yieldable member interconnecting the hydrogen source to the chamber comprises a conduit or tubing member having a folded, bent or otherwise curved section that is designed to bend or flex during the movement of the dissociation chamber during its alignment in properly positioning the beam along a predetermined path. The means for moving the yieldable member may be by means of micrometer screws or any other means that would exert and maintain a force directly upon the chamber for proper directional alignment.

In the invention, the dissociator is accurately alignable to transfer its hydrogen atoms of a selected hyperfine state to a microwave cavity, a dielectric container having outer surfaces which have been coated with a conductive coating in a predetermined configuration to suppress oscillation in undesirable modes and promote oscillation in the desired mode. The body forming the microwave cavity is substantially of dielectric material, having an outer surface defining a microwave cavity that is tuned to about the hydrogen resonance frequency of 1.4 GHz. In this invention, the ends and sides of the cavity are provided with a discontinuous coating, having a form and configuration to react with microwave energy in the cavity at about the hydrogen resonance frequency to suppress oscillation in the microwave cavity in undesirable modes. The cavity has on its internal surface coating which produces minimum perturbation of the atomic energy states.

The dissociator and microwave cavity of this invention thus coact to present within the microwave cavity a maximum obtainable portion of hyperfine hydrogen atoms generated by the dissociator and to enhance the detection of the hyperfine atoms at hydrogen resonance frequency.

Furthermore, in this invention, the carrier frequency generated from the standard frequency of the VCXO is reliably locked at hydrogen resonance frequency rather than one of the phase modulation sidebands of the carrier, resulting in a predictable, accurate, and stable standard frequency. To achieve such operation, the frequency standard includes means to vary the frequency of the VCXO that acts as a source of the standard frequency through a range of frequencies less than a range corresponding to the large frequency modulation used in maintaining the tuning of the microwave cavity at hydrogen resonance frequency and means to control the output of the small frequency modulation oscillator, the outputs of the system phase detectors, and the output of the means ranging the frequency of the VCXO.

In initiating operation of the frequency standard, the correct operating point of the passive hydrogen maser is selected by interrupting the small modulation of the carrier generated from the output of the VCXO while providing the larger frequency modulation of the carrier and maintaining the cavity tuned at hydrogen resonance frequency, varying the frequency of VCXO over a range of frequencies between, but somewhat less than, the frequencies of the first sidebands of the carrier due to the large frequency modulation used to maintain microwave cavity tuning, sampling the electromagnetic energy of the microwave cavity, demodulating the sampled energy, and detecting when the carrier is at hydrogen resonance frequency, and terminating the frequency variation of the VCXO, locking and maintaining the VCXO at the frequency corresponding to the generation of a carrier at hydrogen resonance frequency by modulating the carrier with a small frequency, which is preferably several orders of magnitude smaller than the large modulation frequency, and providing the VCXO frequency as a standard frequency output.

The accompanying drawings, which are a part of this patent specification, illustrate a preferred embodiment of the subject invention and, together with the description herein, serve to explain the principles of the invention. Other features of the invention will be apparent from the drawings and the following description.

DESCRIPTION OF THE PREFERRED EMBODIMENT

Figure 1:
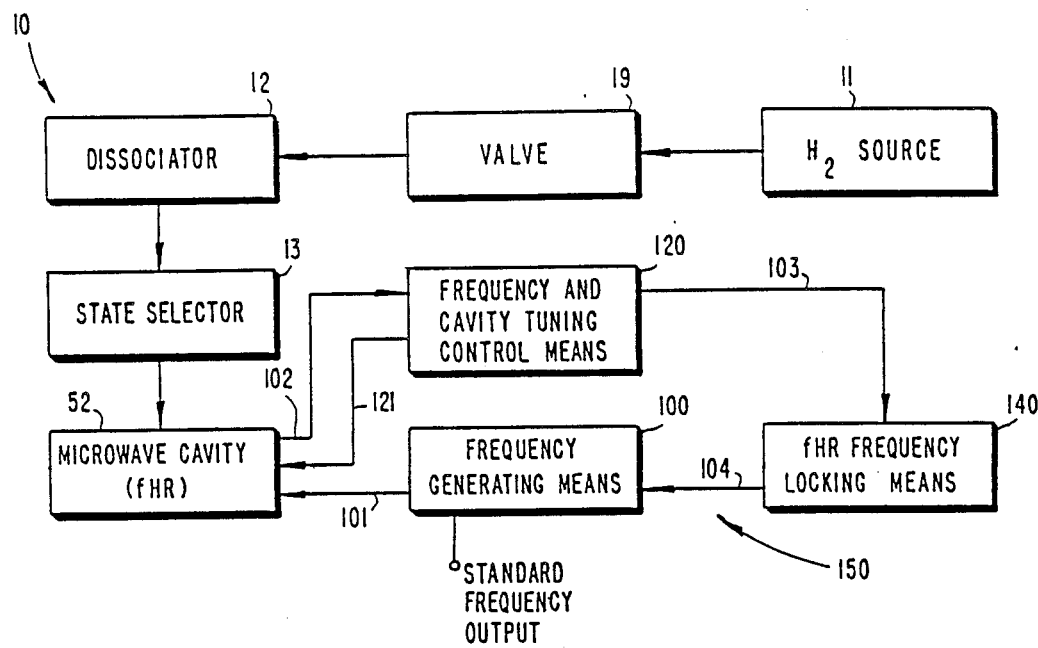
FIG. 1 is a block diagram of the frequency standard of this invention, illustrating its major components.

A frequency standard system of this invention is illustrated in the block diagram of FIG. 1. A passive hydrogen maser comprises a source of hydrogen gas 11, means to dissociate the hydrogen gas and provide a stream of hydrogen atoms, including hydrogen atoms in the desired hyperfine state, a state selector 13 to focus hydrogen atoms out of the stream if they are not in the desired hyperfine state, and an assembly 52 forming a microwave cavity tuned to about hydrogen resonance frequency ($f$HR). A palladium leak valve 19 controls the flow of hydrogen from the hydrogen source 11 to the dissociator 12. A frequency-generating means 100 generates a variable frequency range including the standard frequency in its mid range and a frequency multiplier sufficient to increase the standard frequency to hydrogen resonance frequency ($f$HR), about 1.4 GHz. The frequency-generating means 100 also includes two modulation frequency generators, the first modulation frequency generator 111 (FIG. 6) providing a small frequency (e.g., 12 Hz) and the second modulation frequency generator 112 (FIG. 6) providing a large frequency several orders of magnitude larger than the small frequency (e.g., 12 KHz). The large modulation frequency is selected to provide a range large enough to probe the microwave cavity for effects of aging and environmental perturbations. The small modulation frequency is chosen to permit close control of the microwave carrier to maintain it at the hydrogen resonance frequency. The multiplied standard frequency, which is about equal to the hydrogen resonance frequency, is used as a carrier and modulated by the small and large modulation frequencies to control the standard frequency and to maintain the cavity tuned at hydrogen resonance frequency in the manner known in the art.

The modulated carrier from frequency-generating means 100 is applied to the microwave cavity means 52 by microwave input connection 101. The energy of the microwave cavity is sampled over microwave output connection 102, which is connected with frequency and cavity-tuning control means 120. Frequency and cavity-tuning control means 120 detects variations of the microwave carrier from the hydrogen resonance frequency, provides a frequency correction signal over frequency correction lines 103 and 104, detects detuning of the microwave cavity 52 from the hydrogen resonance frequency, and provides corrective action over cavity-tuning line 121.

Hydrogen resonance frequency-locking means 140 permits the start-up of the system with the frequency-generating means 100 locked at the standard frequency which generates a carrier whose precise multiple is equal to the hydrogen resonance frequency so that the frequency and cavity control means 120 can maintain a predictable, accurate, and stable standard frequency at the standard frequency output of the frequency-generating means 100. Frequency-generating means 100, frequency and cavity control means 120, and frequency-locking means 140 comprise an electronic control means 150 connected with the passive hydrogen maser 10 and adapted to enhance the use of the frequency defined by the hyperfine transition of the atoms in order to maintain an accurate and stable standard frequency.

Figure 2:
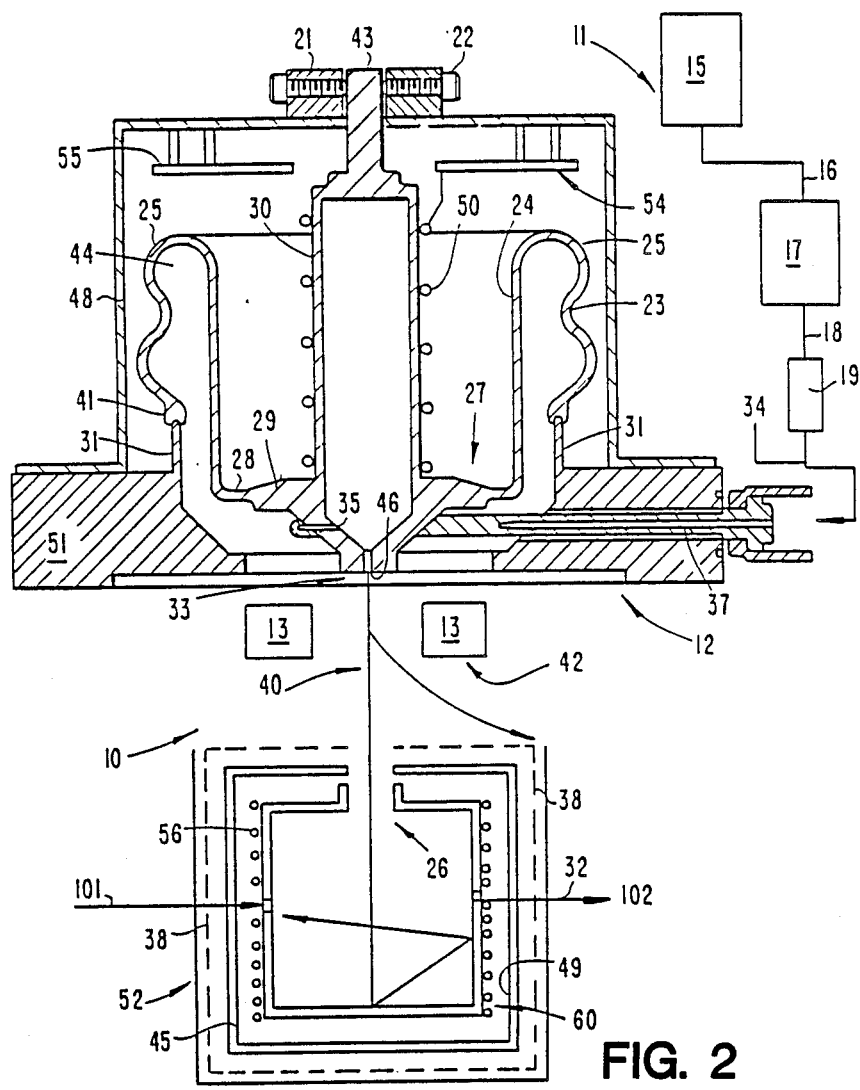
FIG. 2 is a side-section view of the dissociator device of this invention (top portion of drawing) along with a representation of a passive hydrogen maser system incorporating the present invention.
Figure 3:
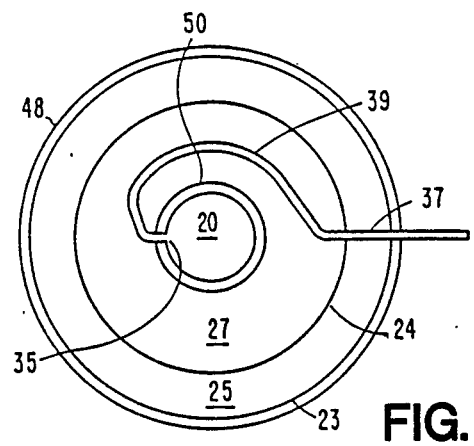
FIG. 3 is a bottom view of the dissociator of the invention.
Figure 4:
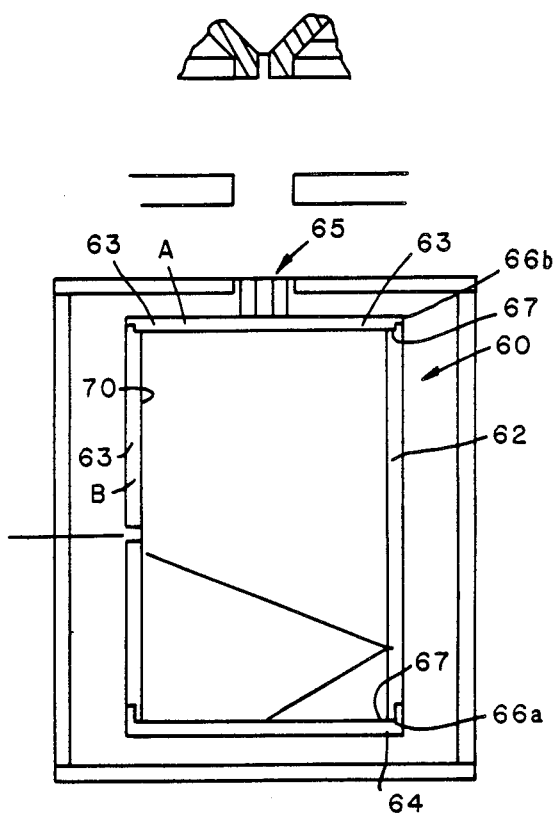
FIG. 4 is a side section view showing the structure of the cell forming the microwave cavity of the invention.

The passive hydrogen maser 10 of this invention is shown schematically in FIG. 2, said maser comprising a hydrogen supply means 11, a dissociator device 12, a state selector 13 and a microwave cavity assembly 52. Hydrogen gas is furnished by a supply means 11 comprising a hydrogen storage container 15 that is connected by line 16 to a pressure transducer 17 and, thereafter, by line 18 to a palladium leak valve 19 that leads into the dissociator 12 via line 34. The dissociator device 12 comprises a base or housing 51 having a sidewall 48 and collar 21 in which turnable micrometer screw members 22 are set therein. Supported within the housing 51 and secured to a sleeve 31 thereof is a dissociator assembly 20 comprising an outer upright wall 23 and an inner upright wall 24 connected together by an intermediate curved portion 25. The lower leg of wall 24 is integrally affixed to an annular member 27 which has an extended first and second connecting portions 28 and 29, respectively, that unite with a cylindrical chamber 30 in which dissociation is to take place, said chamber 30 being provided with an orifice 46 located at the apex of a dimple portion 47 at one end and a stem 43 at the other which extends into and through the collar 21. Generally, the orifice 46 may have a diameter between about 0.1 mm to about 0.3 mm. It is preferred that the dimple portion have a bore or tubular opening therethrough terminating at orifice 46 thereby providing a small nozzle-like structure. Cylindrical chamber 30 is provided with an inlet 35 for the introduction of hydrogen via a line 34 coming from the palladium leak valve 19. Line 34 passes into base 51 via a straight tube 37 (FIG. 3) and a curved tube 39 that communicates with the inlet 35 that opens into chamber 30. It is to be noted that tube 37 and curved tube 39 form a scythe-shaped configuration which offers some degree of resilience for a purpose to be described in more detail below.

As shown in the drawing the dissociator assembly 20, which is usually fabricated of glass, is fusion bonded along a bonding surface 41 to the sleeve 31 that forms a concentric circle around the cylindrical chamber 30. The outer wall 23 is provided in cross section with a curved surface that leads to an intermediate curved portion 25 defining a U-shaped contour that interconnects the outer wall 23 with the inner wall 24, the outer and inner walls being spaced apart to provide an annular chamber 44. As shown in FIG. 2, the inner wall 24 is connected at its lower leg to first and second connecting portions 28 and 29 that unite said inner wall 24 to the cylindrical chamber 30.

The annular chamber 44 defines a vertical annular space circumferentially about and situated from the longitudinal axis of the cylindrical chamber 30 as well as a horizontally disposed annular space connecting therewith and extending between the base 51 and the annular member 27 and extending as well beneath the cylindrical chamber 30. Thus, the chamber 30 is, to some extent, free-floating as it is supported by the annular member 27.

The dissociator of this invention may be readily fabricated of glass and therefore would have a design that provides some degree of resilience. The dissociator may be readily formed from a silicate glass, especially borosilicate glass (viz., Pyrex Glass Brand No. 7740) by conventional glass forming techniques. The dissociator is to function within a vacuum system and generally is subjected to pressures within the chamber below about 1 mm Hg.

In a preferred embodiment, the dissociator may be fabricated of different borosilicate glasses that are compatible with one another. In practice, the cylindrical chamber 30 is made of Pyrex Glass Brand No. 7740. the annular member 27 including the adjacent portion of the inner wall 24 is made of Pyrex Glass No. 3320 and the intermediate curved portion 25 and upright outer wall is fabricated of Pyrex Glass No. 7052. The last named glass is readily bondable to sleeve 31 and has the lowest softening temperature. Further, Pyrex Glass No. 3320 has an expansion coefficient of about midway between that of the other two glasses. In practice, it has been found advantageous to make an initial alignment prior to installation into a maser device by placing the dissociator unit formed of said three different glasses in an oven or annealing chamber at the softening temperature of the No. 7052 glass, then making any necessary alignment and, thereafter, cooling the dissociator to affix that alignment. In this fashion an initial coarse alignment is established and finer adjustment may be readily made by fine adjustment of micrometer screw means or the like.

Micrometer screws 22 may be turned or indexed to the proper setting to place a force against the stem 43 to cause bending and displacement of the yieldable means including the intermediate curved portion 25 that acts as a flexible linkage between the cylindrical chamber 30 and the housing 51. It will be appreciated that the chamber 30 may be displaced or deflected over a plurality of points about collar 21 to cause corresponding changes in the orientation of the orifice 46. Since the U-shaped structure comprising walls 23 and 24 along with curved portion 25 is fabricated of vitreous material and designed in the afore-described yieldable configuration, a substantial degree of flexural movement is achievable to provide full radial displacement of the orifice about the longitudinal axis by merely adjusting the corresponding micrometer screw or screws to effect the same. In effect, orifice 46 acts as a beam-directing nozzle with discrete range orientations.

As the hydrogen gas passes from the dissociation chamber 30, more hydrogen is continuously supplied to the chamber 30 by means of the palladium leak valve 19 which purifies the hydrogen and at the same time maintains a steady state pressure in the dissociation chamber, generally about 0.1. Torr hydrogen pressure. To form the plasma or gaseous discharge, r.f. power (not shown) is connected to means associated with chamber 30, said means being coupled externally around the cylindrical surface of chamber 30 with either two probes or a coil, depending on whether an inductive coupling or capacitive coupling scheme is employed.

It will be appreciated that all of the components of the dissociator are all rigid and made of glass or metal. This is a most favorable construction as a practical matter for a high-vacuum system in that no extraneous vapors or gases are introduced from decomposition of chemically unstable media as would be the case if portions or components were made of materials comprising elastomers, plastics and the like.

In FIG. 2, the r.f. power is coupled by an inductive coil 50 which is supplied by an adequate power source, not shown. The dissociator is provided with a oscillator circuit 54 operating at a frequency of between about 50 to 150 MHz, the circuit being mounted on a stand off board 55. In viewing the discharge region in actual operation of the hydrogen maser, a reddish purple coloration characteristic of atomic hydrogen is observed that is caused by the molecular hydrogen being constantly dissociated by collisions with hot electrons in the gaseous plasma. The atomic hydrogen produced in the discharge region issues from the orifice 46 in the form of a stream or beam 40 that pass through a state selecting magnet 13 disposed adjacent the dissociation chamber 20 which focuses out hydrogen atoms 42 that are not in the desired hyperfine energy state. In effect, the magnetic field established by the state selector throws out along path 42 atoms in the lower hyperfine state and passes atoms along 40 in the upper hyperfine state.

As previously discussed, it can now be appreciated that the beam 40 may be readily aligned most advantageously with the microwave cavity 49 by movement of screw means 22 which orients the chamber 20. The beam 40 of selected atoms is directed through a cavity opening 26 which acts as a passageway to permit only axially directed atom 40 in the beam from the orifice 46 to enter into a microwave cavity 49 of the microwave cavity assembly 52. The microwave cavity 49 is formed by the outer surfaces at a cell 60 of dielectric material as further described below. Generally, the microwave cavity 49 operates in the $TE_{011}$ mode. The cavity 49 is surrounded by concentric moly-permalloy magnetic shielding 38. A static magnetic field is produced by a coil 56 outside the microwave cavity to separate the Zeeman levels of the upper hyperfine state.

For a good filling capacity, the dielectric cell 60 forming the microwave cavity 49 may take a number of shapes but generally it is in the form of a right circular cylinder with either a separate or integrated bulb for containment of the hydrogen atoms.

As is known, when the microwave cavity 49 is tuned close to the transition frequency and when the intensity of the incoming beam of atoms is large enough, oscillation can take place in which the incoming hydrogen atoms in the upper energy level are stimulated to radiate a signal having an exceedingly stable frequency. In effect, the hydrogen atoms that enter the microwave cavity 49 enter an interaction region in an upper hyperfine state and are stimulated to make transitions to the lower hyperfine state. The generated signal is picked up by the microwave output loop 32 which is connected to microwave output connection 102 and is used to lock VCXO to the stable hydrogen transition frequency by the electronic control means 150.

The microwave cavity assembly 52 is the main device for generating the energy at hydrogen resonance frequency from the quantum mechanical particles undergoing resonance transitions between discrete energy levels. The cell 60 of this invention provides a cavity that is readily tunable by temperature to a predetermined value and provides suppression of oscillations in undesired modes, and one with a reduced radial r.f. magnetic field and reduced frequency shift due to Crampton effect. The structural and/or design features of cell 60 are important features of this invention.

For a good filling capacity, the cell 60 forming the microwave cavity 49 may take a number of shapes. The cell used in this invention is specially designed and may be in a shape of a right circular cylinder with sealingly engaged end walls to define an enclosed microwave cavity 49. The cylinder and end walls may be fabricated from a range of dielectric materials, particularly those compositions having a dielectric constant greater than 9. It has been found that glass or ceramic, especially alumina ceramic materials are well suited for such fabrication. As indicated above, one end wall forms a passageway 26 to permit a stream of hydrogen atoms to be directed into the microwave cavity.

The inner walls of the microwave cavity 49, which include the internal surfaces of the cylinder structure and the two end walls thereof, are provided with nonperturbative coating. The main purpose of the coating is to minimize interactions within the cavity or cell and, therefore, to control the quantum mechanical particle collisions so that there is a reduction in wall shift. The coating is generally a dichlorodimethylsilane, tetrafluoroethylene, fluorinated ethylene-propylene, or a long straight chain saturated hydrogen. It has been found advantageous to use tetrafluoroethylene as it renders an effective sealing material along joining surfaces and makes an excellent bond therebetween. It is preferred that after coating the internal surfaces, the resonator be placed in an oven or annealing chamber at a temperature sufficient to soften and coalesce the coated resin thereto. The internal coating of the resonator cell is thus formed into a continuous layer that offers a tight seal that is highly suitable for maintaining low pressures or vacuum systems since the joined surfaces are united and held firmly together. The internal coating thickness should range from about one to two thousandths of an inch in order to be effective as nonperturbative coating. Several coating may be applied successively in order to achieve the desired thickness.

An important feature of the microwave assembly 52 is that the cell 60 has an external conductive coating. The cylinder and end walls are treated on their external portions with a conductive composition of a "predetermined configuration" to be described in more detail hereinafter. The conductive material itself may be any of a number of conductive compositions. In one embodiment it has been found advantageous to use first a copper base coating directly on the external surface of a ceramic resonator cell followed by an overlayer of rhodium and thereafter gold. Generally, the first copper coating may be introduced as a mere flash coating by conventional electroless technique and thereafter by using conventional electrodeposition to further increase the thickness of the copper. The chromium and gold may be readily deposited thereon. A suitable range of thicknesses for the various metal layer is: about 10 to about 100 microinches of copper, about 10 to about 125 microinches of rhodium and about 10 to about 100 microinches of gold. Such three layered systems of metals provides a substantial advantage over the prior art in that the subject system is less prone to bond failures or weakening thereof between the ceramic and metal interface and when deposited in the desired predetermined configuration has the effect of suppressing oscillations of undesired fields or modes. In addition, the outer layer of conductive metal allows it to be integrally bonded or brazed to various joint structures and the like to thereby secure the whole within the maser apparatus 10.

The microwave cavity 49 is tuned to resonate in the fundamental mode to the frequency of the wave emitted by the atoms during transition from higher to lower energy levels. When the cavity 49 is tuned close to the transition frequency and the intensity of the incoming hydrogen atoms is large enough, and microwave energy is introduced into the cavity 49 at the hydrogen resonance frequency, oscillation takes place in which the atoms in the upper energy level are stimulated to radiate a signal having an exceedingly stable frequency. Thus, the atoms that enter the resonator enter an interaction region in an upper hyperfine state and are stimulated to make transitions to the lower hyperfine state. In the case of hydrogen, the generated signal at hydrogen resonance frequency is picked up by a microwave output loop and is used to lock the VCXO of frequency-generating means 100 to the stable hydrogen transition energy by the electronic control means 150.

A microwave cavity generally operates in the $TE_{011}$ mode and is usually surrounded by a suitable magnetic shielding such as molypermalloy or the like. The resonator cell is located in a region of a constant phase, axial radio frequency electromagnetic field within the cavity and tuned to the hyperfine transition frequency of hydrogen, approximately at 1.420,450,751 GHz. Further, a static magnetic field is produced by coil 56 outside the microwave cavity 99 to separate the Zeeman levels of the upper hyperfine state.

The cell 60 forming the microwave cavity 49 is a hollow, circular, cavity-forming structure having fixed end walls. The external surface of said resonator cell has a discontinuous coating on the circular sidewall portion and a discontinuous coating on the fixed end walls to form the conductive coating into a predetermined configuration adapted to interact with the microwave energy and suppress oscillation in undesirable modes. The microwave cavity is associated with means for exciting said microwave cavity with electromagnetic energy in a predetermined mode of oscillation. The configuration of the conductive coating on the outer surfaces of the end walls comprises at least one concentric ring on each surface whose centers are coincident with the longitudinal axis of the circular cavity structure to provide the desired predetermined configuration at hydrogen resonance frequency with the cavity 49 operating in the $TE_{011}$ mode.

FIGS. 4, 5A, 5B, and 5C depict views of the electrical resonator cell of the subject invention. As can be observed the electrical resonator cell 60 comprises a hollow circular structure 61 having an outer surface coated by a thin conductive layer 62. End wall 63 is provided with an opening 65; and as noted in FIGS. 5A and 5B, the end walls 63 and 64 are coated by a thin, discontinuous, conductive coating 62a and 62b, said end wall coating taking a pattern of one or more concentric rings. The end walls 63 and 64 are provided with grooves 66a, 66b (FIG. 4) which interlock with the internal grooves 67 of cylinder 61.

Figure 5A:
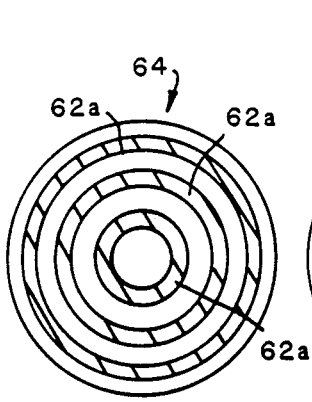
FIGS. 5A and 5B are end views of the microwave cavity cell.
Figure 5B:
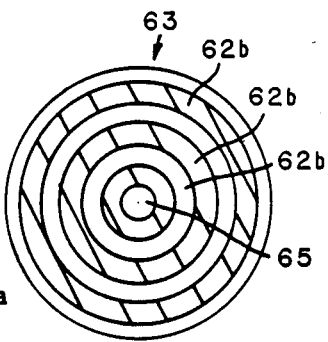
Figure 5C:
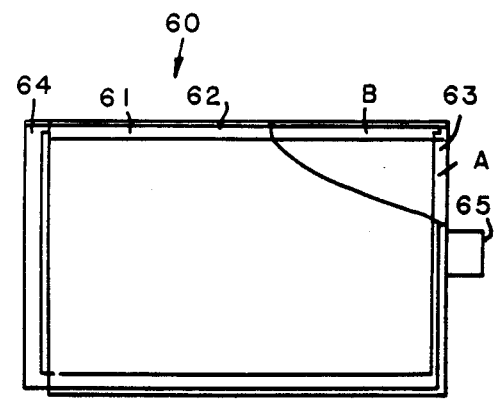
FIG. 5C depicts a view of the microwave cavity cell.

As shown in FIGS. 5A and 5B, the conductive coatings on the end portions of cell 60 which forms the microwave cavity are discontinuous. The discontinuous end coatings have been applied in a predetermined configuration comprising, in the preferred embodiment, a plurality of concentric rings. As shown in FIG. 5A, the bottom end 64 of cell 60 has been discontinuously coated with conductive material to form four, narrow rings 62a that are arranged coaxially and concentrically about the central axis of cell 60 on the outer surface of bottom end 64. The upper end 63 of cell 60 is also discontinuously coated with conductive material to form three, narrow rings 62b that are concentrically and coaxially arranged about the central axis of cell 60 and orifice 65 through which hydrogen atoms are introduced into the microwave cavity. The diameters of rings 62a on the bottom end of cell 60 and the diameters of the rings 62b on the outer surface of the upper end 63 may be unequal, with the outermost ring 62b on the upper end 63 of the cell extending inwardly from the outer periphery of the end 63 and the outermost ring of the bottom end 64 being spaced inwardly from the outer periphery of bottom end 64 a distance about equal to the width of the ring 62b. This predetermined configuration defines several concentric, conductive rings formed on the outer surfaces of the ends 63 and 64 of cell 60 and does not interfere with oscillation of the microwave cavity 49 in the $TE_{011}$ mode but suppresses oscillations in other undesirable modes.

For a good filling capacity, the cavity 60 may take a number of shapes. The cavity resonator in accordance with the subject invention is specially designed and may be in a shape of a right cylinder structure 61 with sealingly engaged end walls 63 and 64 to define means to displace or exclude atoms experiencing energy transitions and an enclosed cavity in which such energy transitions occur. The cylinder structure 61 and end walls 63 and 64 may be fabricated from a range of dielectric materials, particularly those compositions having a dielectric constant greater than 9. It has been found that glass or ceramic, especially alumina ceramic materials are well suited for such fabrication. One end wall is provided with an opening or aperture 65 for open communication between the inner and outer portions of the cavity resonator 60. In one embodiment, the internal length of the cavity along its longitudinal axis is about six inches; the thickness of the cylinder structure is about one inch; and the thickness of the end walls are each about one-fourth inch.

The inner walls of the cavity resonator 60 that include the internal surfaces of the cylinder structure 61 and the two end walls 63 and 64 thereof are provided with an energy state minimizing coating 70. The main purpose of the coating 70 is to minimize interactions within the cavity and, therefore, to control the quantum mechanical particles collision rate so that there is a reduction in wall shift. The coating is generally a dichlorodimethylsilane, tetrafluoroethylene, fluorinated ethylene-propylene, or a long straight chain saturated hydrogen. It has been found advantageous to use tetrafluoroethylene as it renders a coating that is energy state minimizing and serves as an effective sealing material along joining surfaces and makes an excellent bond therebetween. It is preferred that, after coating the internal surfaces, the resonator be placed in an oven or annealing chamber at a temperature sufficient to soften and coalesce the coated resin thereto. The internal coating of the resonator cell is thus formed into a continuous layer that offers a tight seal that is highly suitable for maintaining low pressures or vacuum systems since the joined surfaces are united and held firmly together. The internal coating thickness should range from about one to two thousandths of an inch in order to be effective as an energy state minimizing coating. Several coating may be applied successively in order to achieve the desired thickness.

An important structural feature of the subject cavity resonator is that its end walls 63 and 64 provide a filled region A and B, respectively, of dielectric material that wards off hydrogen atoms from entering the regions immediately adjacent or proximate to the conductive coating 62. The thickness of the dielectric coating may vary over a wide range depending on the size of the cavity rseonator. For a small resonator made in accordance with the subject invention the thickness of the dielectric material was about one-twenty-fourth the length of the cavity resonator.

As set forth above, the cylinder structure 61 and end walls 63 and 64 are treated on their external portions with a conductive composition in a predetermined configuration. The conductive material of coating 62 itself may be any of a number of conductive compositions. In one embodiment, it has been found advantageous to use three different layers: first a copper base coating directly on the external surface of a ceramic cavity resonator followed by an overlayer of chromium and thereafter gold. Generally, the first copper coating may be introduced as a mere flash coating by conventional electroless technique and thereafter by using conventional electrodeposition to further increase the thickness of the copper. The chromium and gold may be readily deposited thereon.

A suitable range of thicknesses for the various conductive or metal layer is: about 0.50 to about 100 microinches of copper, about 0.50 to about 125 microinches of chromium and about 0.25 to about 75 microinches of gold. Such three-layered system of metals provides a substantial advantage over the prior art in that the subject system is less prone to bond failures or weakening at the ceramic and metal interface. Moreover, when made in accordance with the predetermined configuration, as set forth above, the conductive coating has the effect of suppressing oscillations of undesired fields or modes. In addition, the layer of conductive metal allows it to be integrally bonded or brazed to various joint structures and the like to thereby secure the whole within the maser apparatus.

Figure 6:
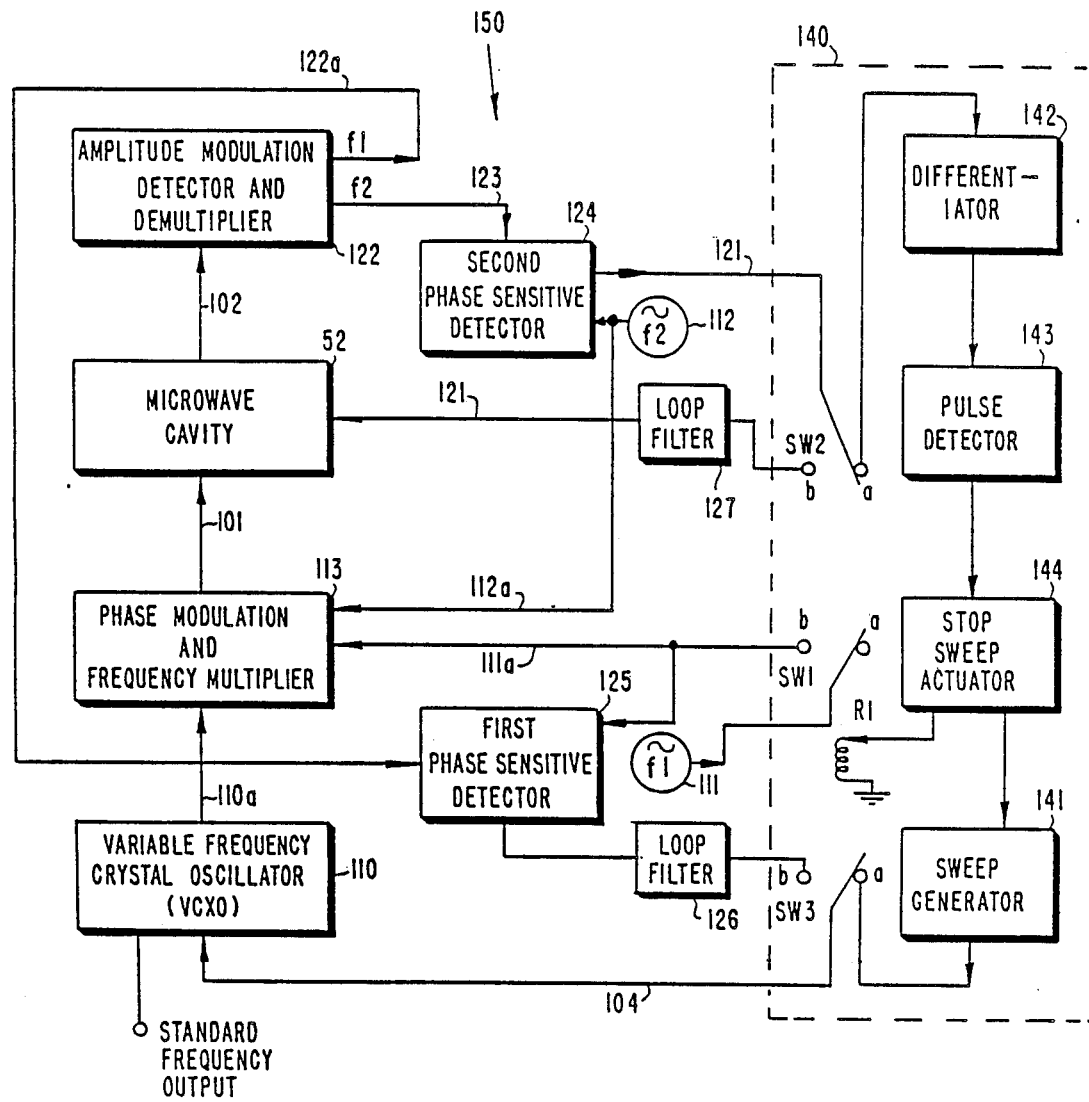
FIG. 6 is block diagram of the circuit of this invention.

FIG. 6 illustrates the electronic control means to generate a standard frequency and a multiple of the standard frequency for injection into the microwave cavity at hydrogen resonance frequency and to lock the standard frequency and its exact multiple with the hydrogen resonance frequency by using the microwave cavity assembly 52 of passive hydrogen maser 10 and to maintain the standard frequency at a predictable, accurate, and stable value notwithstanding aging of the system and variations in the environment in which it operates.

As shown in FIG. 6, the frequency-generating means 100 of electronic control means 150 includes a voltage variable cystal oscillator (VCXO) 110, a first modulation frequency oscillator 111 to generate small modulation frequencies, such as 12 Hz, a second frequency modulation oscillator 112 to generator large modulation frequencies, such as 12 KHz, and a phase modulation and frequency multiplier 113. The voltage variable crystal oscillator is designed to provide a variable range of frequencies, including a standard frequency such as 5 MHz, preferably located in the middle of its variable frequency range. The small frequency modulation oscillator 111 generates a small frequency, such as 12 Hz, to modulate the standard frequency prior to its multiplication in circuit 113 and introduction into the microwave cavity. The small frequency of, for example, 12 Hz provides an error signal to permit corrective action in the event the standard frequency tries to vary and introduce a frequency into the microwave cavity other than the hydrogen resonance frequency. The large modulation frequency of, for example, 12 KHz generated by the large frequency modulation oscillator 112 modulates the standard frequency prior to its multiplication in circuit 113. The modulation frequency of 12 KHz probes the microwave cavity for the tuning effect of aging and environmental changes, such as changes in pressure, aging of the cavity coating, and deformation of the cavity to strain or said shock or changes of the temperature and the like. The sensitivity of tuning of the cavity to such effects is apparent when it is considered that its frequency sensitivity due to changing in the length of the cavity, for example, is about 400 KHz per millimeter. In order to decrease the response time of the system in correcting the standard frequency for variations, it is advisable to increase the small modulation frequency to reduce the system response time; however, to increase the reliability and predictability of the system in locking the standard frequency with the hydrogen resonance frequency, it is desirable that the small modulation frequency be several orders of magnitude less than the large modulation frequency; therefore, in the preferred embodiment of this invention, the large modulation frequency is preferably a thousand times greater than the small modulation frequency. The standard frequency, modulated by 12 Hz and 12 KHz, is multiplied by the factor of 288 in the phase modulation and frequency multiplier 113 to provide a modulated carrier for application to the microwave cavity assembly 52 over its microwave input connection 101 (FIG. 2).

The combined energies of the microwave input connection 101 and of the hyperfine hydrogen atoms within the microwave cavity 49 are sensed in the microwave cavity assembly 52 and connected over microwave output connection 102 to an amplitude modulation detector and demultiplier circuit 122. The amplitude modulation detector and demultiplier circuit 122 provides two outputs corresponding to the small modulation frequency $f_1$ and a large modulation frequency $f_2$ that are used in the operation of the system in a manner to be described below.

As shown in FIG. 6, the electronic control means 150 includes means to lock an exact multiple of this standard frequency with the hydrogen resonance frequency; that is, during the start-up of the system of this invention, the carrier frequency ($28B \times 5$ MHz) generated by the frequency generation means 100, rather than one of the carrier sidebands generated by the phase modulation and frequency multiplier 113, is locked with the energy released in the microwave cavity 49 by the hydrogen atoms. Because of the close carrier sidebands due to the small modulation frequency, prior frequency standards had a tendency to frequently, unpredicably, and inaccurately lock the standard frequency with one of the close carrier sidebands detected within the microwave cavity. The second small frequency sidebands of the carrier were particularly troublesome in prior systems. The system of this invention provides means 140 to lock the carrier which is a precise multiple of standard frequency (in this system, 288 times the 5 MHz standard frequency) with the hydrogen resonance frequency.

As shown in FIG. 6, means 140 includes switch means, SW1, SW2, and SW3 to control the output of the small frequency modulation oscillator, the outputs of the system phase detectors and the variation of the VCXO frequency. During start-up, the switch means disable the small frequency modulation of the carrier, apply a sweep generator 141 to the VCXO 110, and connect the demodulated and demultiplied output of the microwave cavity assembly 52 with means to detect when the multiplied standard frequency applied to the microwave cavity over input connection 101 is equal to the hydrogen resonance frequency. When the multiplied standard frequency equal the hydrogen resonance frequency, the switch means stop the sweep generator and connect the frequency and cavity-tuning control means (FIGS. 1 and 6), into the electronic control means to lock and maintain the standard frequency at a frequency corresponding to the hydrogen resonance frequency.

The system may be designed to operate means 140 and switches S1–S3 automatically on any start-up or manually at any time chosen by the system operator. Although the switches are shown in FIG. 6 as being operated by a relay $r_1$, semiconductor switches may be used. It is advantageous if a relay is used that it be relatively fast acting and consume minimal power.

When the means 140 is operating in locking the standard frequency of the VCXO 110 to the hydrogen resonance frequency, switches SW1, SW2, and SW3 are connected to the a terminals, as shown in FIG. 6 and disconnected from the b terminals. The output of sweep generator 141 is thus applied through switch SW3 to the VCXO 110. Sweep generator 141 and VCXO in their operation vary the frequency of the VCXO through a range including the standard frequency. Preferably, the range of variation of the VCXO frequency is a range somewhat less than the range of those frequencies which, when multiplied by the frequency multiplier circuit of circuit 113, are the frequencies corresponding to the first upper and lower sidebands of the carrier produced by its modulation by the large frequency output of the second modulation oscillator 112.

During the operation of the f HR frequency-locking means 140 and the frequency sweeping of the VCXO, the first modulation oscillator 111 is disconnected from the system by SW1, and the microwave energy introduced in the microwave cavity assembly 52 over the microwave input connection 101 is not modulated by the small frequency of the first modulation oscillator 111. As the frequency of the VCXO 110 is varied by sweep generator 141, the energy within the microwave cavity 49 is sensed over the microwave output connection 102. As a result of the operation of the amplitude modulation detector and demultiplier circuit 122, a detected and demultiplied output of circuit 122 is connected over the $f_2$ connection 123 with the second phase detector 124 whose other input is connected with an output of the second modulation oscillator 112. When the microwave energy introduced into the microwave cavity 52 over line 101 is at hydrogen resonance frequency and the hyperfine hydrogen atoms introduced into the microwave cavity are urged into transition to a lower energy state and release their energy at hydrogen resonance frequency, their energies coincide within the microwave cavity. The detected output of the microwave cavity on connection 102 produces a signal by the action of circuits 122 and 124 that is usable to stop the sweep generator 141, lock the standard frequency of the VCXO 110 with the hydrogen resonance frequency, and operate switches SW1, SW2, and SW3 so that electronic control means 150 can maintain the standard frequency locked with the hydrogen resonance frequency.

The signal generated by circuits 122 and 124 is connected with the switch SW2 of the frequency-locking means 140 as shown in FIG. 6. Frequency-locking means 140 includes a differentiator 142 and a pulse detector 143 connected with a stop sweep actuator 144. Thus, the rapid change of energy within the microwave cavity 52 produces a signal which, when differentiated by the differentiator 142, provides a pulse. Pulse detector 143 provides an output which is used by stop sweep actuator 144 to stop the sweep generator 141 and to actuate relay $R_1$, thereby connecting the contacts of SW1, SW2, and SW3 to their b terminals and disconnecting their a terminals. Although the means 140 has been described as using a differentiator, pulse detector and stop sweep actuator circuits, such circuits are illustrative of a preferable means of controlling sweep generator 141 and are not intended to represent the only means by which sweep generator 141 and the other means of electronic circuit means 150 may be controlled.

With switches SW1–SW3 connected to their b terminals, the standard frequency of the VCXO 110 is maintained at 5 MHz; and its exact 288th multiple is applied to the microwave cavity assembly 52. This carrier is, however, modulated by the small frequency $f_1$ through the application of the output of the first modulation oscillator 111 through the b connection of SW1 to the phase modulation and frequency multiplier circuit 113. Any variation of the standard frequency generates an error signal from the $f_1$ output of the amplitude modulation detector and demultiplier circuit 122 which is applied over line 122a to the first phase-sensitive detector 125. The output of the first modulation oscillator 111 is applied through the b terminal of switch SW1 to the other input to the first phase-sensitive detector 125; and in the event of variation of the standard frequency, the first phase-sensitive detector produces an error signal which is applied through the first loop filter 126 and the b terminal of switch SW3 to the VCXO 110 to prevent deviation of the standard frequency.

Effects which tend to detune the microwave cavity from the hydrogen resonance frequency produce a signal from the amplitude modulation detector and demultiplier circuit 122 over $f_2$ connection 123 to the second phase-sensitive detector 124. The other input of the second phase-sensitive detector 124, as set forth above, is connected with the second modulation oscillator 112. Variations of cavity tuning produce an output signal over line 121 which is connected through the b terminal of SW2 to second loop filter 127 and to the microwave cavity assembly 52 to provide a corrective action to maintain the microwave cavity tuned to the hydrogen resonance frequency in the manner known in the art.

As demonstrated by the specifications set forth below, the invention described above provides a compact, commercially usable frequency standard with exceptional accuracy and stability.

| SPECIFICATIONS | |
|---|---|
| ELECTRICAL | |
| Output | 5 MHz sine wave, 1 Vrms into 50 |
|  | 2 buffered outputs |
|  | 110 dB isolation output to output |
| Phase noise: | −113 dB at 1 Hz |
| (SSB 1 Hz BW) | −135 dB at 10 Hz |
|  | −155 dB at 100 Hz |
| Short Term | $2 \times 10^{-13}$ at 100 s |
| (Allan Variance) | $2 \times 10^{-14}$ at 10,000 s |

-continued

| SPECIFICATIONS | |
|---|---|
| Long-Term Drift | $1 \times 10^{-14}$ at 1 day |
| | $1 \times 10^{-15}$/day |
| Maximum Frequency Change | $1 \times 10^{-12}$ over life of unit |
| Retrace (Turn-Off Turn-On) | $5 \times 10^{-13}$ |
| Input Power (Steady State) | 70 W at 28 VDC |
| Warm-up Time | 24 Hours to lock |
| Tuning Resolution | $1 \times 10^{-14}$ |
| ENVIRONMENTAL | |
| Temperature Co-efficient | $5 \times 10^{-14}$/C. within 0 C. to +50 C. |
| Magnetic Field Sensitivity | $1 \times 10^{-13}$ for 1 Oe external field change |
| Humidity | 95% relative humidity noncondensing |
| PHYSICAL | |
| Size | 10.5" high by 20" deep, 19" |
| Weight | 70 lbs. |

While we have described a preferred embodiment of the invention, other embodiments of the invention will be apparent to those skilled in the art; and such embodiment and the equivalents of the described embodiments are covered by the scope of the following claims.

We claim:

1. A frequency standard, comprising:
   frequency-generating means for generating electromagnetic energy at variable frequencies;
   a hydrogen maser adapted to generate electromagnetic energy at hydrogen resonance frequency; and
   electronic means connecting said hydrogen maser to said frequency-generating means to lock and maintain the frequency of said frequency-generating means at an accurate, stable, standard frequency with the electromagnetic energy generated by the hydrogen maser at hydrogen resonance frequency, said hydrogen maser comprising:
   a microwave cavity assembly comprising a dielectric container having outer and inner surfaces, said outer surface of said container defining a microwave cavity tuned to about the hydrogen resonance frequency, said container having an aperture therein for open communication between the inner and outer portions of said container, and having on an end wall a discontinuous conductive coating with a predetermined configuration to suppress undesirable oscillation of the microwave cavity;
   a dissociator having a chamber for generating hydrogen atoms with an opening serving as an exit and forming a narrow beam of said hydrogen atoms and yieldable member means; and
   means for moving the yieldable member means to align the narrow beam of hydrogen atoms with the aperture.

2. The frequency standard of claim 1 wherein the dielectric container is formed of a dielectric material selected from a group consisting essentially of ceramic and glass in the form of a circular cylindrical body having fixed end walls, said body having a continuous conductive composition bonded to its cylindrical outer surface and having a discontinuous conductive coating of predetermined configuration on both end walls thereof.

3. The frequency standard of claim 1 wherein the predetermined configuration of the discontinuous coating is in the form of at least one concentric ring whose center is coincident with the aperture of the container.

4. The frequency standard of claim 2 wherein the predetermined configuration of the discontinuous conductive coating is in the form of a plurality of rings on both end walls, said plurality of rings being concentric and coaxial with the longitudinal axis of said cylindrical body.

5. The frequency standard of claim 1 wherein the container further includes magnetic shielding structures and an associated heating means controllable to 1/100° C. at a temperature of about 70° C. surrounding said container.

6. The frequency standard of claim 1 wherein the resonator further includes a solenoid means surrounding said resonator to supply a low-value, quantizing magnetic field thereto.

7. The frequency standard of claim 6 wherein said quantizing magnetic field has an intensity of about $10^{-8}$T.

8. The frequency standard of claim 1 wherein said microwave cavity assembly includes coarse and fine tuning means connected with said electronic control means for controlling the resonance frequency of the microwave cavity.

9. The frequency standard of claim 1 wherein said electronic means comprises:
   first means to detect variation of energy of said microwave cavity due to variation of frequency-generating means from an exact submultiple of the hydrogen resonance frequency and to maintain the frequency of the frequency-generating means locked with the hydrogen resonance frequency;
   second means to detect variations of energy of said microwave cavity due to detuning of the microwave cavity and to maintain the microwave cavity tuned to the hydrogen resonance frequency; and
   third means for varying the frequency of the frequency-generating means through a range less than the cavity-tuning range, for detecting when said frequency-generating means is providing a signal that is an exact multiple of said hydrogen resonance frequency, and for disconnecting said third means and connecting said first means to said frequency-generating means when said standard frequency is an exact multiple of said hydrogen resonance frequency.

10. The frequency standard of claim 1 wherein the yieldable member comprises inner and outer walls spaced apart and connected by an intermediate section and an annular portion interconnecting said inner wall to said chamber.

11. The frequency standard of claim 1 wherein the dissociation chamber is a cylindrical vessel having a stem portion secured to the upper part of said chamber.

12. The frequency standard of claim 1 wherein a tubing means partially circumscribes the dissociation chamber to define a deflectable section surrounding the same.

13. A frequency standard, comprising:
   frequency-generating means for generating electromagnetic energy at variable frequencies;
   a hydrogen maser including means to direct a stream of hydrogen atoms at a hyperfine energy state into a microwave cavity assembly to generate electromagnetic energy at hydrogen resonance frequency; and
   an electronic means to control the frequency of said frequency-generating means to maintain a standard frequency with the electromagnetic energy generated by said hydrogen maser, said microwave cavity assembly including a dielectric container defining by its outer surfaces a microwave cavity that is tuned to about hydrogen resonance frequency and including a discontinuous conductive coating on an end wall thereof in a predetermined configuration to suppress undesired oscillation of the microwave cavity, said electronic means being connected with the microwave cavity assembly and the frequency-generating means and comprising:

first means to detect variation of energy of said microwave cavity due to variation of frequency and to maintain an exact multiple of the frequency of the frequency-generating means locked with the hydrogen resonance frequency;

second means to detect variations of energy of said microwave cavity due to detuning of the microwave cavity and to maintain the microwave cavity tuned to the hydrogen resonance frequency; and third means for varying the frequency of the frequency-generating means through a range less than the cavity-tuning range for detecting when said frequency-generating means is providing a signal that is exactly multiplied to equal said hydrogen resonance frequency, and for disconnecting said third means and connecting said first means to said frequency-generating means when said standard frequency is an exact multiple of said hydrogen resonance frequency.

14. The frequency standard of claim 13 wherein the dielectric container is formed of a dielectric material of ceramic glass in the form of a circular cylindrical body having fixed end walls, said body having a continuous conductive composition bonded to its cylindrical outer surface and having a discontinuous conductive coating of predetermined configuration on both end walls thereof.

15. The frequency standard of claim 13 wherein the predetermined configuration of the discontinuous coating is in the form of at least one concentric ring whose center is coincident with the aperture of the container.

16. The frequency standard of claim 14 wherein the predetermined configuration of the discontinuous conductive coating is in the form of a plurality of rings on both end walls, said plurality of rings being concentric and coaxial with the longitudinal axis of said cylindrical body.

17. The frequency standard of claim 13 wherein the container further includes magnetic shielding structures and an associated heating means controllable to 1/100° C. at a temperature of about 70° C. surrounding said container.

18. The frequency standard of claim 13 wherein the resonator further includes a solenoid means surrounding said resonator to supply a low intensity quantizing magnetic field thereto.

19. The frequency standard at claim 18 wherein said quantizing magnetic field has an intensity of above $10^{-8}$ T.

20. The frequency standard of claim 13 wherein said microwave cavity assembly includes coarse and fine tuning means connected with said electronic control means for controlling the resonance frequency of the microwave cavity.

21. The frequency standard of claim 13 wherein said hydrogen maser includes a dissociator having a chamber for generating hydrogen atoms and an opening serving as an exit and forming a narrow beam of said hydrogen atoms and yieldable member means for aligning the narrow beam of hyperfine hydrogen atoms with said microwave cavity.

22. The frequency standard of claim 21 wherein said yieldable member means comprises inner and outer walls spaced apart and connected by an intermediate section, and an annular portion interconnecting said inner wall to said chamber.

23. The frequency standard of claim 21 wherein the chamber is a cylindrical vessel provided with a stem portion secured to the upper part of said chamber.

24. The frequency standard of claim 21 wherein the inlet for the introduction of molecular species comprises a tubing extending through the base of said dissociator and in communication with said chamber.

25. The frequency standard of claim 21 wherein the tubing partially circumscribes the dissociation chamber to define a deflectable section surrounding the same.

26. The frequency standard of claim 13 wherein said third means includes a plurality of switches to disconnect said first means until the frequency-generating means is locked to the energy being generated at hydrogen resonance frequency by said hydrogen atoms, to connect a sweep generator of said third means with the frequency generating means, and to connect a signal corresponding to the energy generated in said microwave cavity with the third means, said third means including circuit means for generating signals stopping the sweep generator when the frequency-generating means is at standard frequency and actuating the plurality of switches to disconnect the sweep generator from the frequency generating means and to connect the first and second means with the frequency-generating means and microwave cavity assembly, respectively.

27. A frequency standard, comprising:

a frequency-generating means adapted to provide a first output at standard frequency and a second output at a frequency multiple of the standard frequency equal to hydrogen resonance frequency that is connected with the microwave cavity of a hydrogen maser;

first means to detect variations of energy of said microwave cavity due to variation of the frequency of the frequency-generating means from a multiple of the hydrogen resonance frequency and to maintain the standard frequency at a multiple of the hydrogen resonance frequency;

second means to detect variations of energy of said microwave cavity due to detuning of the microwave cavity and to maintain the microwave cavity tuned to the hydrogen resonance frequency; and third means for varying the frequency of the frequency-generating means through a range less than the cavity-tuning range, for detecting when said frequency-generating means is providing a signal corresponding to said hydrogen resonance frequency, and for disconnecting said third means and connecting said first means to said frequency-generating means when said standard frequency is an exact multiple of said hydrogen resonance frequency.

28. A frequency standard including a passive hydrogen maser, comprising:

a source of hydrogen atoms in a hyperfine state;

a microwave cavity tuned to about hydrogen resonance frequency, adapted to be tunable over a cavity-tuning range sufficiently large to correct for physical and electrical changes tending to detune said cavity from hydrogen resonance frequency; and electronic circuit means adapted to provide microwave energy to said microwave cavity and to provide an essentially constant, drift free, standard frequency, said electronic circuit means further comprising:

a variable frequency energy source adapted to be maintained at said standard frequency and to be variable through about a cavity tunable range of frequency;

a sweep generator connectable with said variable frequency energy source and adapted to drive said variable frequency energy source from about one extreme of the cavity tunable range frequencies to about the other extreme;

a phase modulator and a frequency multiplier having a first input connected with said variable frequency a first input connected with said variable frequency energy source and an output connected with said microwave cavity, said frequency multiplier multiplying the frequency of said energy source by a multiple sufficient to provide an output frequency equal to the hydrogen resonance frequency when the frequency of said variable frequency energy source is in mid range;

a first modulation frequency source connectable with a second input to said phase modulator through a first switch, said first modulator frequency being adapted to provide a small frequency modulation of the frequency of the variable frequency energy source;

a second modulator frequency source connected with a third input to said phase modulator, said second modulator frequency being several orders of magnitude greater than the first modulator frequency;

an amplitude modulation and demultiplication circuit connected with a micorwave energy sensor coupled to said microwave cavity, said amplitude modulation and demultiplication circuit providing a first demodulated frequency output corresponding to said frequency of said first modulation frequency source and a second demodulated frequency corresponding to said second modulation frequency source; and a second frequency phase detector having one input connected with said second frequency source and a second input connected with said second demodulated frequency output of the amplitude demodulation and demultiplication circuit, and having an output connectable through a second switch with (a) a detection circuit connected with said sweep generator and (b) a loop filter input to said microwave cavity, said second frequency phase detector when connected with said detector circuit providing a signal that will stop the sweep generator from varying the frequency of variable frequency energy source when its frequency equals the standard frequency and is multiplied by said multiplier circuit to equal the hydrogen resonance frequency, said electronic circuit further including means to operate said first and second switches and to connect said first modulation frequency source to said second input of the phase modulator, whereby the input to the microwave cavity is urged to vary from the hydrogen resonance frequency by a small amount, said electronic circuit further comprising a first frequency phase detector having a first input connected with the first demodulated frequency output of the amplitude modulation detector and demultiplication circuit and a second input connectable through said first switch to said first modulation frequency source and through a third switch to said variable frequency energy source whereby as the input to the microwave cavity tends to vary from hydrogen resonance frequency, said amplitude demodulator and demultiplier circuit and said first frequency phase detector generate a corrective signal and apply it to said variable frequency oscillator to maintain its output at the standard frequency, said second switch being operated to connect the output of said second frequency phase detector to said microwave cavity whereby said amplitude demodulator and demultiplier circuit and said second frequency phase detector generate a signal and apply it to said microwave cavity to maintain the cavity tuning at about the hydrogen resonance frequency, said third switch disconnecting said sweep generator from said electronic circuit.

29. A method of selecting the correct operating point for a passive hydrogen maser time standard including a cavity tuned to about hydrogen resonance frequency, comprising:

providing a source of state-selected hydrogen atoms;

providing an energy source having an output frequency that is variable within a cavity tunable range, said energy source being operable to provide an output at a substantially constant, drift-free frequency usable as a time standard, varying the frequency of the energy source from a frequency at about one extreme of the cavity tunable range of frequencies toward the other extreme of the cavity tunable range of frequencies;

modulating the frequency of the energy from the energy source with second modulation frequency less than the cavity tunable range of frequencies available from the energy source and, multiplying the modulated output frequency from the energy source by a multiplier to provide hydrogen resonance frequency within mid range of the cavity tunable range of said energy source;

introducing said multiplied and modulated energy and said hyperfine hydrogen atoms into said microwave cavity and sampling the energy of the cavity as the multiplied and modulated energy from said energy source is varied from one extreme of the cavity tunable range toward the other extreme of the cavity tunable range;

detecting the energy of the cavity as the multiplied and modulated frequency is varied from one extreme of the cavity tunable range to the other extreme of the cavity tunable range and through the hydrogen resonance frequency to detect coincidence of the multiplied and modulated frequency of the energy source with the hydrogen resonance frequency of the hyperfine hydrogen atoms in the cavity; and stopping the variation of the frequency of the energy source at the frequency which multiplied equals the hydrogen resonance frequency and locking said energy source into a closed loop control system by modulating said output frequency of said energy source by a small modulation frequency which tends to vary the frequency of source from said standard frequency by a small amount, sensing the energy of cavity and demodulating and demultiplying the sensed energy of the cavity, comparing the phase of the demodulated and demultiplied cavity energy with the phase of the small modulation frequency and generating a corrective signal to lock the frequency of the energy source into a standard frequency with the energy of hydrogen atoms corresponding to hydrogen resonance frequency.

30. The method of claim 29 wherein said demodulated and demultiplied cavity energy is compared with the phase of the second frequency source to produce a cavity-tuning error signal and said cavity-tuning error signal is applied to said cavity to maintain the cavity tuning at about hydrogen resonance frequency.

* * * * *